US011983435B2

(12) United States Patent
Meyerowitz et al.

(10) Patent No.: US 11,983,435 B2
(45) Date of Patent: *May 14, 2024

(54) OPTIMIZE INFORMATION REQUESTS TO A MEMORY SYSTEM

(71) Applicant: Micron Technology, Inc., Boise, ID (US)

(72) Inventors: Trevor Conrad Meyerowitz, Morgan Hill, CA (US); Dhawal Bavishi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 35 days.

This patent is subject to a terminal disclaimer.

(21) Appl. No.: 17/382,195

(22) Filed: Jul. 21, 2021

(65) Prior Publication Data

US 2021/0349659 A1 Nov. 11, 2021

Related U.S. Application Data

(63) Continuation of application No. 16/058,645, filed on Aug. 8, 2018, now Pat. No. 11,074,007.

(51) Int. Cl.
*G06F 12/00* (2006.01)
*G06F 3/06* (2006.01)
*G11C 5/04* (2006.01)

(52) U.S. Cl.
CPC .......... *G06F 3/0656* (2013.01); *G06F 3/0617* (2013.01); *G06F 3/0619* (2013.01);
(Continued)

(58) Field of Classification Search
CPC .... G06F 3/0656; G06F 3/0617; G06F 3/0619; G06F 3/0659; G06F 3/0685;
(Continued)

(56) References Cited

U.S. PATENT DOCUMENTS 5,535,340 A 7/1996 Bell et al.
5,862,338 A 1/1999 Walker et al.
(Continued)

FOREIGN PATENT DOCUMENTS

| CN | 100422920 C | * | 10/2008 | ........... G06F 3/0605 |
| FR | 3026513 A1 | * | 4/2016 | ......... G06F 12/0246 |
| KR | 102450514 B1 | * | 10/2022 | |

OTHER PUBLICATIONS

International Search Report and Written Opinion, PCT/US2019/043304, dated Nov. 7, 2019.
(Continued)

*Primary Examiner* — Mardochee Chery
(74) *Attorney, Agent, or Firm* — Greenberg Traurig

(57) ABSTRACT

A system having a processing device and a controller, operatively connected to a memory sub-system via a communication channel, to: store information identifying an amount of available capacity of a buffer of the memory sub-system; transmit, through the communication channel to the memory sub-system, one or more write commands to store data in memory components of the memory sub-system, where the memory sub-system queues the one or more write commands in the buffer; update the information by deducting, from the amount of available capacity, an amount of buffer capacity used by the one or more write commands to generate a current amount of available capacity of the buffer; and determine whether to generate an information request to the memory sub-system based at least in part on the current amount of available capacity.

20 Claims, 5 Drawing Sheets

(52) U.S. Cl.
CPC .......... G06F 3/0659 (2013.01); G06F 3/0685 (2013.01); G06F 3/0688 (2013.01); G11C 5/04 (2013.01)

(58) Field of Classification Search
CPC ...... G06F 3/0688; G06F 3/061; G06F 3/0613; G06F 3/0679; G11C 5/04
USPC ........................................................ 711/101
See application file for complete search history.

(56) References Cited

U.S. PATENT DOCUMENTS

| | | | |
|---|---|---|---|
| 6,006,289 | A | 12/1999 | James et al. |
| 6,189,080 | B1 | 2/2001 | Ofer |
| 6,457,143 | B1 | 9/2002 | Yue |
| 6,665,088 | B1 | 12/2003 | Chiba et al. |
| 7,249,222 | B1 | 7/2007 | Bellis et al. |
| 7,301,791 | B2 | 11/2007 | Atwood et al. |
| 7,573,753 | B2 | 8/2009 | Atwood et al. |
| 7,647,436 | B1 | 1/2010 | Westrelin et al. |
| 8,190,804 | B1 | 5/2012 | Srinivasan et al. |
| 9,552,323 | B1 | 1/2017 | Finan et al. |
| 10,372,606 | B2 | 8/2019 | Malladi et al. |
| 10,969,994 | B2 | 4/2021 | Bavishi et al. |
| 11,074,007 | B2 | 7/2021 | Meyerowitz et al. |
| 2001/0011323 | A1 | 8/2001 | Ohta et al. |
| 2002/0059476 | A1 | 5/2002 | Yamada |
| 2002/0091965 | A1 | 7/2002 | Moshayedi |
| 2002/0108005 | A1 | 8/2002 | Larson et al. |
| 2004/0193822 | A1 | 9/2004 | Kareenahalli et al. |
| 2006/0104283 | A1 | 5/2006 | Suzuki |
| 2007/0006070 | A1 | 1/2007 | Baartman et al. |
| 2007/0077887 | A1 | 4/2007 | Kuwabara et al. |
| 2007/0180208 | A1 | 8/2007 | Yamasaki |
| 2007/0186065 | A1 | 8/2007 | Lee et al. |
| 2007/0288672 | A1 | 12/2007 | Asano et al. |
| 2008/0222330 | A1 | 9/2008 | Shima |
| 2009/0327535 | A1 | 12/2009 | Liu |
| 2011/0078393 | A1 | 3/2011 | Lin |
| 2012/0047320 | A1 | 2/2012 | Yoo et al. |
| 2012/0066432 | A1 | 3/2012 | Miura |
| 2012/0221767 | A1 | 8/2012 | Post et al. |
| 2012/0328038 | A1 | 12/2012 | Ebisuzaki |
| 2013/0013853 | A1 | 1/2013 | Yeh |
| 2013/0283013 | A1 | 10/2013 | Guok et al. |
| 2014/0181323 | A1 | 6/2014 | Manula et al. |
| 2014/0281338 | A1 | 9/2014 | Choi et al. |
| 2015/0262633 | A1 | 9/2015 | Lee |
| 2015/0363107 | A1 | 12/2015 | Best et al. |
| 2016/0062927 | A1 | 3/2016 | Saga |
| 2016/0139807 | A1 | 5/2016 | Lesartre et al. |
| 2016/0211973 | A1 | 7/2016 | Nale et al. |
| 2016/0313943 | A1 | 10/2016 | Hashimoto et al. |
| 2016/0342548 | A1 | 11/2016 | Hathorn et al. |
| 2017/0192697 | A1 | 7/2017 | Munetoh et al. |
| 2017/0286337 | A1 | 10/2017 | Wang et al. |
| 2018/0032430 | A1 | 2/2018 | Malladi et al. |
| 2018/0039441 | A1 | 2/2018 | Nimura et al. |
| 2018/0059945 | A1 | 3/2018 | Helmick et al. |
| 2018/0059976 | A1 | 3/2018 | Helmick et al. |
| 2018/0081590 | A1 | 3/2018 | Farahani et al. |
| 2018/0157445 | A1 | 6/2018 | Gissin et al. |
| 2018/0188952 | A1 | 7/2018 | Carlton et al. |
| 2018/0188960 | A1 | 7/2018 | Pico |
| 2018/0246643 | A1 | 8/2018 | Jenne et al. |
| 2018/0246662 | A1 | 8/2018 | Kim |
| 2018/0285252 | A1 | 10/2018 | Kwon et al. |
| 2019/0018596 | A1 | 1/2019 | Nemoto et al. |
| 2019/0087332 | A1 | 3/2019 | Jun et al. |
| 2019/0129656 | A1* | 5/2019 | Bains .................... G06F 3/0613 |
| 2019/0189210 | A1 | 6/2019 | Farmahini Farahani et al. |
| 2019/0196716 | A1 | 6/2019 | Xiao et al. |
| 2019/0220224 | A1 | 7/2019 | Lu et al. |
| 2020/0026457 | A1 | 1/2020 | Silbermintz et al. |
| 2020/0050390 | A1 | 2/2020 | Bavishi et al. |
| 2020/0050391 | A1 | 2/2020 | Meyerowitz et al. |
| 2021/0200466 | A1 | 7/2021 | Bavishi et al. |
| 2021/0247915 | A1 | 8/2021 | Pawlowski |

OTHER PUBLICATIONS

International Search Report and Written Opinion, PCT/US2019/043308, dated Nov. 7, 2019.

Extended European Search Report, EP19847154.2, dated Apr. 4, 2022.

* cited by examiner

OPTIMIZE INFORMATION REQUESTS TO A MEMORY SYSTEM

RELATED APPLICATIONS

The present application is a continuation application of U.S. patent application Ser. No. 16/058,645, filed Aug. 8, 2018, issued as U.S. Pat. No. 11,074,007 on Jul. 27, 2021, and entitled "Optimize Information Requests to a Memory System," the entire disclosure of which application is hereby incorporated herein by reference.

FIELD OF THE TECHNOLOGY

Embodiments of the disclosure relate generally to memory systems, and more specifically, relate to optimizing the frequency of information requests transmitted from a host system to a memory system.

BACKGROUND

A memory sub-system can be a storage system, such as a solid-state drive (SSD) or, a memory module, such as a non-volatile dual in-line memory module (NVDIMM), and can include one or more memory components that store data. The memory components can be, for example, non-volatile memory components and volatile memory components. In general, a host system can utilize a memory sub-system to store data at the memory components and to retrieve data from the memory components.

A standardized communication protocol allows the host system to communicate with the memory sub-system to store data and retrieve data.

For example, JEDEC (Joint Electron Device Engineering Council) Solid State Technology Association has proposed a "DDR5 NVDIMM-P Bus Protocol" for communications between a host system and an NVDIMM-P memory module. This protocol is described in detail by the JEDEC Committee Letter Ballot, Committee: JC-45.6, Committee Item Number 2261.13D, Subject: "Proposed DDR5 NVDIMM-P Bus Protocol", which is hereby incorporated by reference herein in its entirety.

BRIEF DESCRIPTION OF THE DRAWINGS

The present disclosure will be understood more fully from the detailed description given below and from the accompanying drawings of various embodiments of the disclosure.

DETAILED DESCRIPTION

At least some aspects of the present disclosure are directed to the optimization of information requests transmitted from a host system to a memory sub-system to reduce communication traffic and/or reduce power consumption. Such optimization of requests can alternatively be employed to increase responsiveness, or to create an intermediate point between responsiveness and traffic. A memory sub-system is also hereinafter referred to as a "memory device". An example of a memory sub-system is a memory module that is connected to a central processing unit (CPU) via a memory bus, such as a dual in-line memory module (DIMM), a small outline DIMM (SO-DIMM), a non-volatile dual in-line memory module (NVDIMM), etc. Another example of a memory sub-system is a storage system, such as a solid-state drive (SSD). In some embodiments, the memory sub-system is a hybrid memory/storage sub-system that provides both memory functions and storage functions. In general, a host system can utilize a memory sub-system that includes one or more memory components. The host system can provide data to be stored at the memory sub-system and can request data to be retrieved from the memory sub-system.

In some computer systems, such as a host system and a memory sub-system that are connected using an NVDIMM-P bus, write commands to store data in the memory sub-system can be buffered in the memory sub-system for execution in a time period that is not predetermined. The host system can issue commands to request information from the memory sub-system, including the information indicative of the available capacity of the memory sub-system for accepting new write commands and their data. Such information indicative of the available capacity can be referred to as write credits. In some instances, sending such requests may not generate useful results, such as when the memory sub-system is not currently expected to have capacity that can be allocated to the host system for sending new write commands. Sending a request to generate a response that is less likely to be useful can result in inefficient use of communication resources and/or can increase power consumption.

At least some aspects of the present disclosure address the above and other deficiencies by the host system adjusting the frequency of information requests according to statistic data of timings of past requests that have generated useful results.

Figure 1:
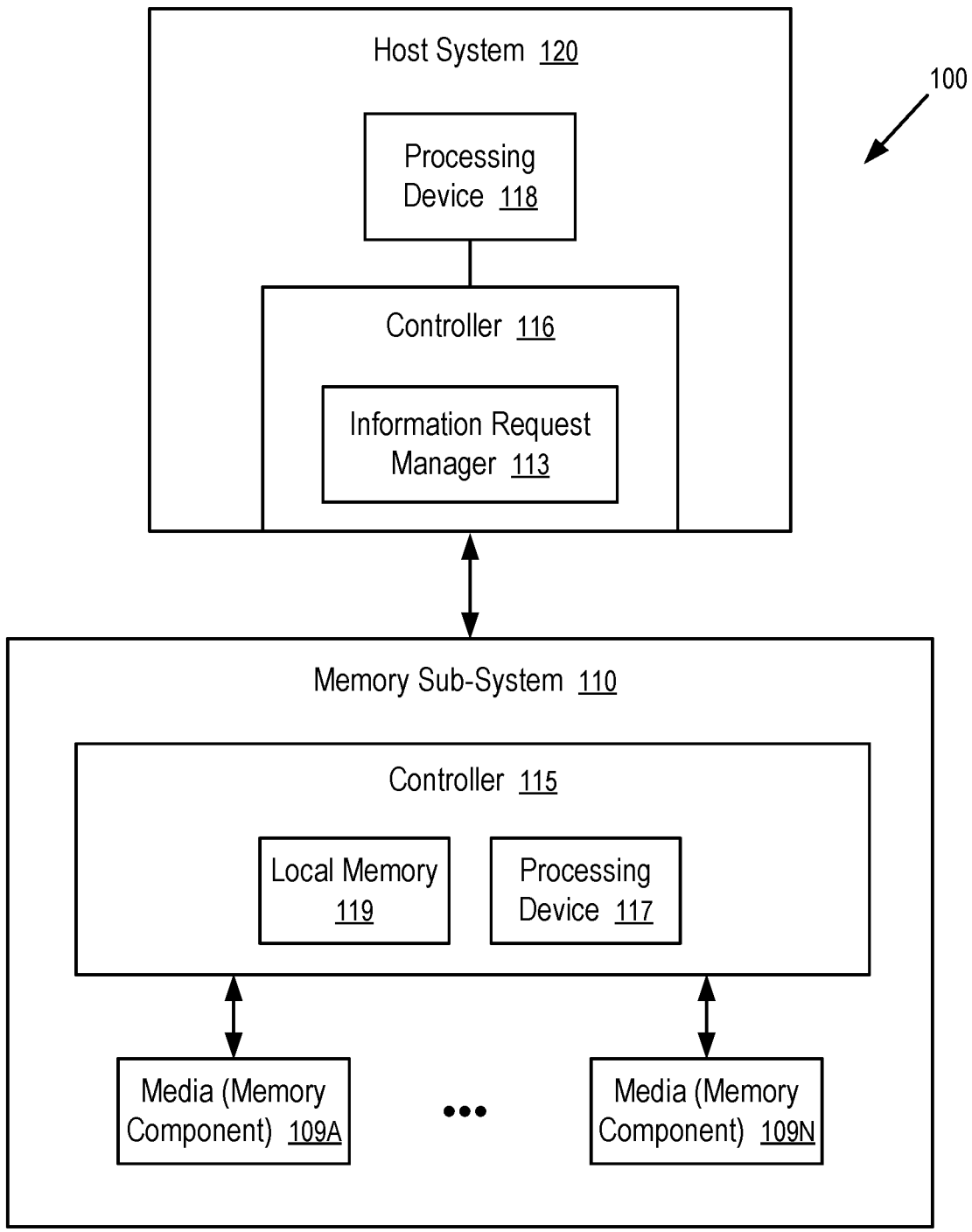
FIG. 1 illustrates an example computing system having a memory sub-system in accordance with some embodiments of the present disclosure.

FIG. 1 illustrates an example computing system 100 having a memory sub-system 110 in accordance with some embodiments of the present disclosure. The memory sub-system 110 can include media, such as memory components 109A to 109N. The memory components 109A to 109N can be volatile memory components, non-volatile memory components, or a combination of such. In some embodiments, the memory sub-system 110 is a memory module. Examples of a memory module includes a DIMM, NVDIMM, and NVDIMM-P. In some embodiments, the memory sub-system is a storage system. An example of a storage system is an SSD. In some embodiments, the memory sub-system 110 is a hybrid memory/storage sub-system. In general, the computing environment can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, etc. The physical host interface can be used to transmit data between the host system 120 and the memory sub-system 110. The host system 120 can further utilize an NVM Express (NVMe) interface to access the memory components 109A to 109N when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The host system 120 includes a processing device 118 and a controller 116. The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110.

In general, the controller 116 can send commands or requests to the memory sub-system 110 for desired access to memory components 109A to 109N. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory components 109A to 109N and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory components 109A to 109N can include any combination of the different types of non-volatile memory components and/or volatile memory components. An example of non-volatile memory components includes a negative-and (NAND) type flash memory. Each of the memory components 109A to 109N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 109A to 109N can be based on any other type of memory such as a volatile memory. In some embodiments, the memory components 109A to 109N can be, but are not limited to, random access memory (RAM), read-only memory (ROM), dynamic random access memory (DRAM), synchronous dynamic random access memory (SDRAM), phase change memory (PCM), magneto random access memory (MRAM), Spin Transfer Torque (STT)-MRAM, ferroelectric random-access memory (FeTRAM), ferroelectric RAM (FeRAM), conductive bridging RAM (CBRAM), resistive random access memory (RRAM), oxide based RRAM (OxRAM), negative-or (NOR) flash memory, electrically erasable programmable read-only memory (EEPROM), nanowire-based non-volatile memory, memory that incorporates memristor technology, and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 109A to 109N can be grouped as memory pages or data blocks that can refer to a unit of the memory component used to store data.

The controller 115 of the memory sub-system 110 can communicate with the memory components 109A to 109N to perform operations such as reading data, writing data, or erasing data at the memory components 109A to 109N and other such operations (e.g., in response to commands scheduled on a command bus by controller 116). The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processing device 117 (processor) configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 109A to 109N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 109A to 109N. The controller 115 can further include host interface circuitry to communicate with the host system 120 via the physical host interface. The host interface circuitry can convert the commands received from the host system into command instructions to access the memory components 109A to 109N as well as convert responses associated with the memory components 109A to 109N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 109A to 109N.

The computing system 100 includes an information request manager 113 in the host system 120 that is configured to optimize the generation of information requests to the memory sub-system 110. In some embodiments, the controller 116 in the host system 120 includes at least a portion of the information request manager 113. For example, the controller 116 can include logic circuitry implementing the information request manager 113. For example, the controller 116 uses the processing device 118 (processor) configured to execute instructions stored in local memory for performing the operations of the information request manager 113 described herein. In some embodiments, the information request manager 113 is part of an operating system of the host system 120, a device driver, or an application.

The information request manager 113 of the host system 120 controls the generation of information requests to increase the effectiveness of the requests and their responses. The information requests can ask the memory sub-system 110 to allocate available buffer capacity in the memory sub-system 110. Based on the allocated buffer capacity, the host system 120 can transmit new write commands and their data to the memory sub-system 110; and the memory sub-system 110 can store the new write commands and their data in the allocated buffer capacity for execution at time instances decided by the memory sub-system 110. The information request manager 113 can delay the generation of an information request based on the amount of the currently allocated buffer capacity usable at the host system 120 and/or the time gap from the previous communication about the allocation of buffer capacity. For example, if the currently allocated buffer capacity usable at the host system 120 to send write commands is above a threshold, the information request manager 113 can delay the generation of an information request. For example, if the currently allocated buffer capacity usable at the host system 120 to send write commands is below the threshold and the elapsed time from the previous allocation of buffer capacity by the memory sub-system 110 is less than a threshold time period, the information request manager 113 can delay the generation of an information request until the elapsed time reaches the threshold time period. The threshold time period can be a predetermined time period, or a time period calculated based on an average speed the memory sub-system 110 can allocate buffer capacity for accepting new write commands. Controlling the generation of information requests in such a way can improve efficiency in the usage of communication resources, such as the bus between the host system 120 and memory sub-system 110. Furthermore, increasing the effectiveness of the information requests can result in reduced power consumption by eliminating and/or combining certain communications. Further details with regards to the operations of the information request manager 113 are described below.

Figure 2:
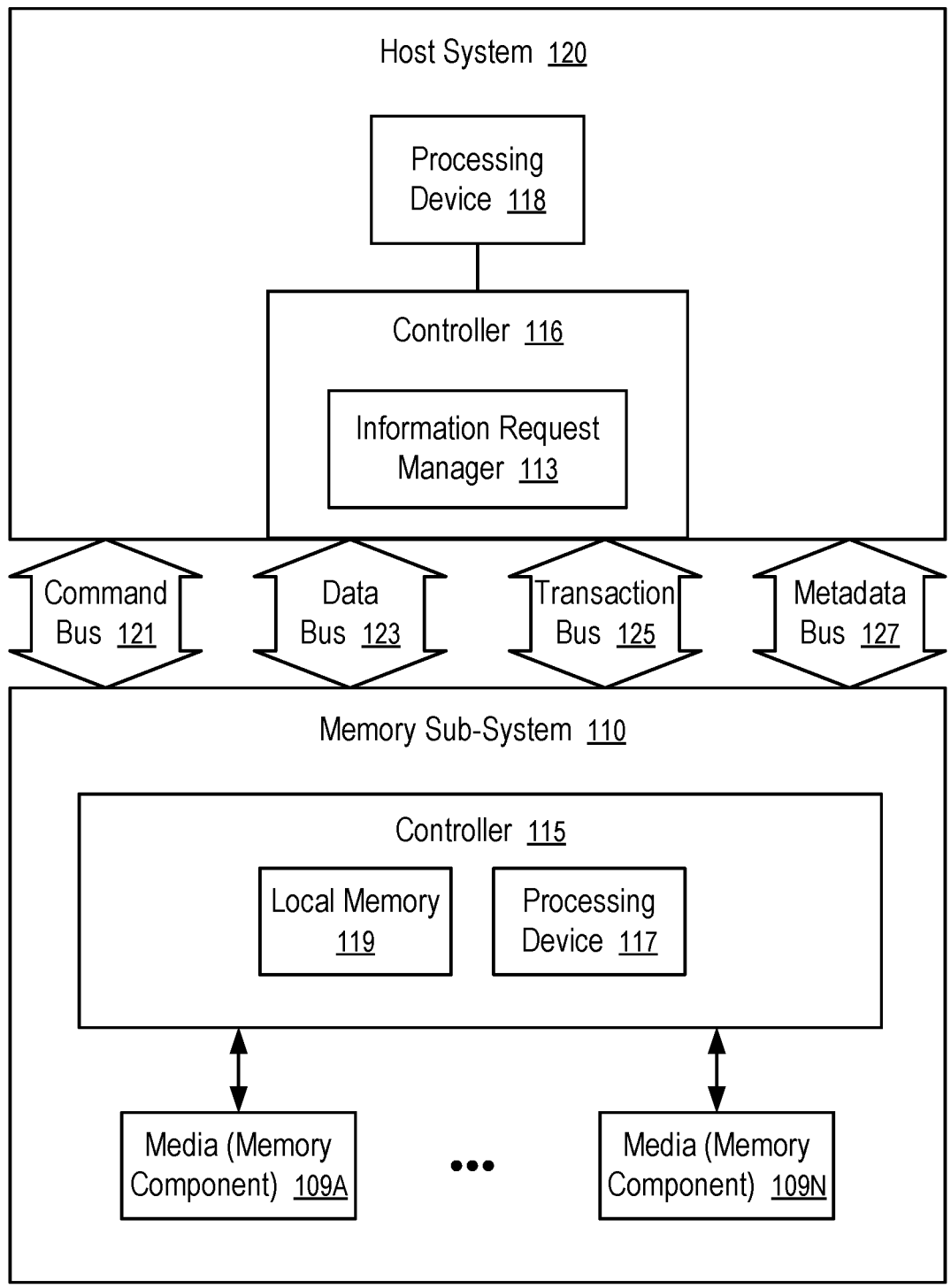
FIG. 2 illustrates an example computing system that includes an information request manager in accordance with some embodiments of the present disclosure.

FIG. 2 illustrates an example computing system that includes an information request manager 113 in accordance with some embodiments of the present disclosure.

Merely for non-limiting purposes of illustration in describing FIG. 2, the controller 116 of the host system 120 is sometimes referred to below as memory controller 116, and the controller 115 of the memory sub-system 110 is sometimes referred to below as media controller 115.

In FIG. 2, the communication channel between the host system 120 and the memory sub-system 110 includes the command bus 121, a data bus 123, a transaction bus 125, and a metadata bus 127. A communication protocol for the communication channel allows asynchronous access to the memory sub-system 110 for data storage and retrieval by the host system 120. For example, the memory sub-system 110 can be an NVDIMM; and the host system 120 can access the memory controller 116 in accordance with a JEDEC NVDIMM-P Bus Protocol using the command bus 121, the data bus 123, the transaction bus 125, and the metadata bus 127.

For example, the memory controller 116 can issue a write command to store data in the memory sub-system 110. After a fixed and predetermined time window from the transmission of the write command on the command bus 121, the memory controller 116 starts transmitting the data on the data bus 123. The memory sub-system 110 is not required to complete the operations of the write command within a predetermined time period. Examples of such a write command include XWRITE and PWRITE identified in the JEDEC NVDIMM-P Bus Protocol.

For example, the memory controller 116 can issue a read command to request information from the memory sub-system 110. The memory sub-system 110 is not required to generate a response within a predetermined time window from the read command. Examples of such a read command include XREAD and SREAD identified in the JEDEC NVDIMM-P Bus Protocol. An XREAD can be given a predetermined read ID to indicate that it is an information request (status_read) that will return system state, but won't access the media directly.

In response to the read command, the memory sub-system 110 prepares data that is requested by the read command. For example, the media controller 115 can retrieve data from media (e.g., 109A, . . . , or 109N) and buffer the retrieve data in the local memory 119 or another memory such that the data can be successfully transmitted to the memory controller 116 within a predetermined time window when such a transmission is requested.

When the requested data is ready for transmission, the memory sub-system 110 can provide a response signal in the transaction bus 125. When the memory controller 116 is informed of the readiness of the memory sub-system 110 to transmit certain data, the memory controller 116 can provide a send command to request the memory sub-system 110 to start transmitting data on the data bus 123 within a predetermined time window from the send command. When responding to the send command, the memory sub-system 115 can also send transaction status information, such as read ID identifying the corresponding read command, write credit information as further discussed below, metadata corresponding to the transaction, and/or error correction code (ECC). An example of such a send command is SEND identified in the JEDEC NVDIMM-P Bus Protocol.

The memory sub-system 110 can buffer read commands and write commands received from the command bus 121 in the local memory 119 or another memory. The media controller 115 can execute the buffered commands in an order different from the order in which the commands are received.

The memory sub-system 110 has a certain amount of capacity for buffering pending read commands and write commands and their associated data. The memory controller 116 and the media controller 115 can communicate with each other to prevent buffer overflow in the memory sub-system 110.

For example, a write credit can be used to represent a unit of buffer capacity that is available for buffering a write command and its associated data of a predetermined size. In some instances, a write command can have data larger than the predetermined size; and such a write command requires multiple write credits for buffering the command and its data in the memory sub-system 110.

The memory controller 116 can maintain a count of write credits it can use to transmit write commands on the command bus 121 to the memory sub-system 110. When a write command is sent over the command bus 121, the memory controller 116 deducts the write credits used by the write command. To avoid buffer overflow, the memory controller 116 should not transmit a write command when the memory controller 116 does not have sufficient write credits for transmitting the write command to the memory sub-system 110.

The media controller 115 can maintain a count of write credits it can return to the memory controller 116 for completed write commands. After a write command buffered in the memory sub-system 110 is completed, the buffer space used by the write command can be freed to accept further write commands from the memory controller 116. The write credits used by the write command that has been completed can be added to the count of write credits that can be returned to the memory controller 116.

The memory sub-system 110 can use the metadata bus 127 to specify the number of write credits it is returning to the memory controller 116. For example, after sending a response signal on the transaction bus 125 to enable the memory controller 116 to issue a send command, the media controller 115 can transmit the number of returned write credits using the metadata bus 127. The memory sub-system 110 can transmit such a response signal in response to a read command, such as XREAD and SREAD identified in the JEDEC NVDIMM-P Bus Protocol. An example of the response signal is RSPx_n identified in the JEDEC NVDIMM-P Bus Protocol.

When the memory controller 116 uses a read command to request retrieval of data from an address, the memory controller 116 can place an address command immediately following the read command to specify the address. Similarly, when the memory controller 116 uses a write command to store data at an address, the memory controller 116 can place an address command immediately following the write command to specify the address. An example of such an address command is XADR identified in the JEDEC NVDIMM-P Bus Protocol.

The memory controller 116 of the host system 120 has a counter of write credits at the host system 120 representing the amount of buffer space known to be available in the memory sub-system 110 to buffer write commands transmitted from the host system 120.

When the host system 120 transmits a write command to the memory sub-system, the memory controller 116 of the host system 120 reduces its counter of write credits at the host system 120 by an amount corresponding to a buffer capacity occupied by the write command and its data. When the host system 120 does not have sufficient write credits to transmit a write command, the host system 120 does not transmit the command to avoid buffer overflow at the memory sub-system 110.

The media controller 115 of the memory sub-system 110 is operable to monitor the write buffer(s) that can be located in the local memory 119 or another memory in the memory sub-system 110. A total count of write credits at the memory sub-system 110 identifies the total buffer capacity available for allocation to the host system 120 for transmitting write commands from the host system 120 to the memory sub-system 110. The total count of write credits at the memory sub-system 110 can be reduced by the write credits transmitted from the memory sub-system 110 to the host system 120. The transferred write credits represent the amount buffer capacity that is allocated for use by the host system 120 to send new write commands. After the write command is executed and cleared from the buffer, the total count of write credits can be increased by the amount of write credits corresponding to an amount of buffer space occupied by the write command in the buffer. When a write command is buffered, the amount of buffer space occupied by the write command in the buffer identifies the amount of write credits used by the write command. The amount of write credits can be determined based on the size of the data associated with the write command. The total count of write credits at the memory sub-system 110 can be reduced by the write credits transmitted from the memory sub-system 110 to the host system 120. The transferred write credits represent the amount of buffer capacity that is allocated for use by the host system 120 to send new write commands. After a write command is executed and/or cleared from the buffer, the total count of write credits can be increased by the amount of write credits used by the write command.

The information request manager 113 of the host system 120 can generate information requests to receive write credits from the memory sub-system 110; and the write credits in the host system 120 indicate an amount of buffer capacity that is allocated for the host system 120 to transmit write commands. Typically, write credits are transmitted from the memory sub-system 110 to the host system 120 as a response to a read command from the host system 120, such as an information request (e.g., RSPx_n identified in the JEDEC NVDIMM-P Bus Protocol) or a request to retrieve data from a particular address (e.g., SREAD, or XREAD identified in the JEDEC NVDIMM-P Bus Protocol).

The information request manager 113 determines whether the host system 120 has more than a threshold number of write credits that can be used to send write commands to the memory sub-system 110. If the total count of write credits available at the host system 110 is currently more than the threshold number, the information request manager 113 postpones the generation of an information request for write credits.

When the total count of write credits available at the host system 110 is currently less than the threshold number, the information request manager 113 determines whether the elapsed time since the previous transfer of write credits from the memory sub-system 110 is longer than a threshold time period. The previous transfer of write credits can be in response to an information request for write credits, or in response to a read command to retrieve data from an address specified in association with the read command.

The threshold time period can be a predetermined configuration parameter. Alternatively, the information request manager 113 can compute the threshold time period for an average time interval for the memory sub-system 110 to transfer at least a threshold number of write credits to the host system 110 (e.g., transferred after the total count of write credits available at the host system 110 is below a predetermined level). The average time interval represents the average speed the memory sub-system 110 can execute buffered write commands to free up write credits for new write commands. For example, based on an estimated speed of executing write commands at the memory sub-system 110, the information request manager 113 estimates or predicts the total write credits available at the memory sub-system 110 for transferring to the host system 120. When the estimated or predicted total write credits available at the memory sub-system 110 is above a threshold, the information request manager 113 can cause the memory controller 116 to transmit an information request that can cause the memory sub-system 110 to transfer the write credits.

Optionally, the information request manager 113 calculates the moving average of time intervals between adjacent transferring of write credits from the memory sub-system 110 to the host system 120. The threshold time period can be dynamically adjusted based on the moving average of the time intervals.

Optionally, the information request manager 113 calculates the average speed of generating write credits in the memory sub-system 110 based on the time interval between two adjacent transferring of the write credits and the amount of write credits transferred at the end of the time interval. The average speed can be used to predict the time interval to a time instance at which the memory sub-system 110 has more than a threshold number of write credits that can be transferred to the host system 120; and the information request manager 113 can delay the generation of an information request according to the predicted time interval. In some instances, the information request manager 113 can calculate a moving average of speed of generating write credits from a number of most recent time intervals of write credit transfers. The moving average can be used to calculate the threshold time period.

Optionally, the information request manager 113 can further postpone the generation of an information request when the memory sub-system 110 has a pending read command from the host system 120. The memory sub-system 110 can used the response to the pending read command to transfer write credits to the host system 120.

Thus, the information request manager 113 can combine and/or reduce communication traffic related to requesting for allocation of buffer capacity for buffering write commands and reduce power consumption associated with the reduced communication traffic.

Figure 3:
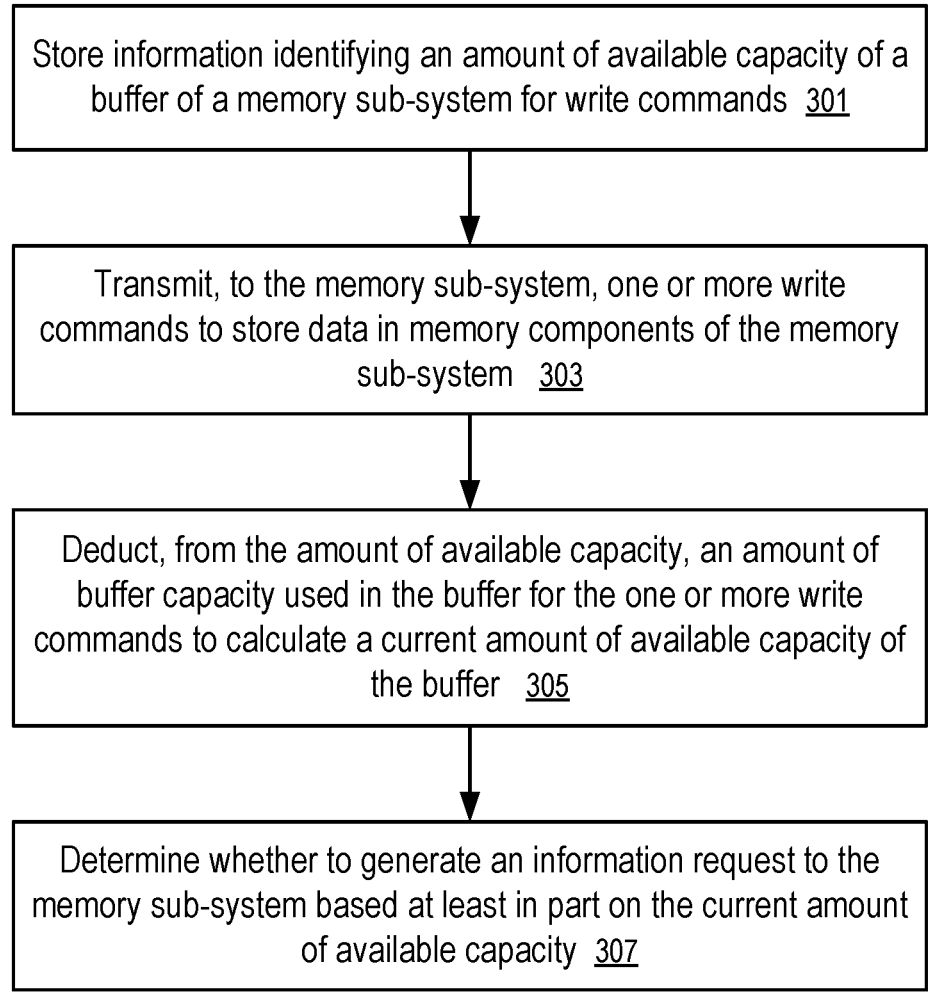
FIG. 3 is a flow diagram of an example method to optimize information requests from a host system to a memory sub-system in accordance with some embodiments of the present disclosure.

FIG. 3 is a flow diagram of an example method to optimize information requests from a host system 120 to a memory sub-system 110 in accordance with some embodiments of the present disclosure. The method of FIG. 3 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 3 is performed at least in part by the information request manager 113 of FIG. 1 or 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 301, the information request manager 113 stores information identifying an amount of available capacity of a buffer of a memory sub-system for write commands. For example, the buffer can be implemented in the local memory 119 or another memory. The amount of available capacity of the buffer has been allocated to the host system 120 for transmitting of the write commands and their data.

At block 303, the memory controller 116 transmits, to the memory sub-system 110, one or more write commands to store data in memory components 109A to 109N of the memory sub-system 110. The memory sub-system 110 queues the one or more write commands in the buffer for execution at time instances determined by the media controller 115 of the memory sub-system 110.

At block 305, the information request manager 113 deducts, from the amount of available capacity, an amount of buffer capacity used in the buffer for the one or more write commands to calculate a current amount of available capacity of the buffer that has been allocated to the host system 120 for transmitting of the write commands and their data.

At block 307, the information request manager 113 determines whether to generate an information request to the memory sub-system 110 based at least in part on the current amount of available capacity. The information request can cause the memory sub-system 110 to allocate buffer capacity for the host system 120 to transmit new write commands.

For example, the information request manager 113 can postpone generation of the information request until the current amount of available buffer capacity is below a threshold. The current amount of available/allocated buffer capacity is usable at the host system 120 to transmit write commands without causing buffer overflow in the memory sub-system 110.

Optionally, the information request manager 113 can postpone generation of the information request until the elapsed time period from a previous communication of an allocated buffer capacity for the host system 120 to transmit write commands is longer than a time interval. By postponing according to the time interval, the information request is likely to be transmitted at a time when the memory sub-system 110 has completed one or more write commands and freed up buffer capacity previously used by the completed write commands such that the freed capacity can be allocated and identified to the host system 120 for the transmission of further write commands.

Optionally, the information request manager 113 can postpone generation of the information request until the information request manager 113 predicts that the memory sub-system 110 has freed up more than a threshold amount of write buffer capacity by completing previously received write commands, such that the information request is sent at a time when the memory sub-system 110 can respond with an identification of more than the threshold amount of write buffer capacity that is allocated for the host system 120 to transmit new write commands and their data.

In some instances, the information request manager 113 can optionally further postpone the generation of the information request until the memory controller 116 of the host system 120 has received responses to all of the read commands that have been previously transmitted to the memory sub-system 110. The memory sub-system can allocate write buffer capacity and transmit an indication of the allocated amount of buffer capacity in connection with responding to any of the pending read commands.

Figure 4:
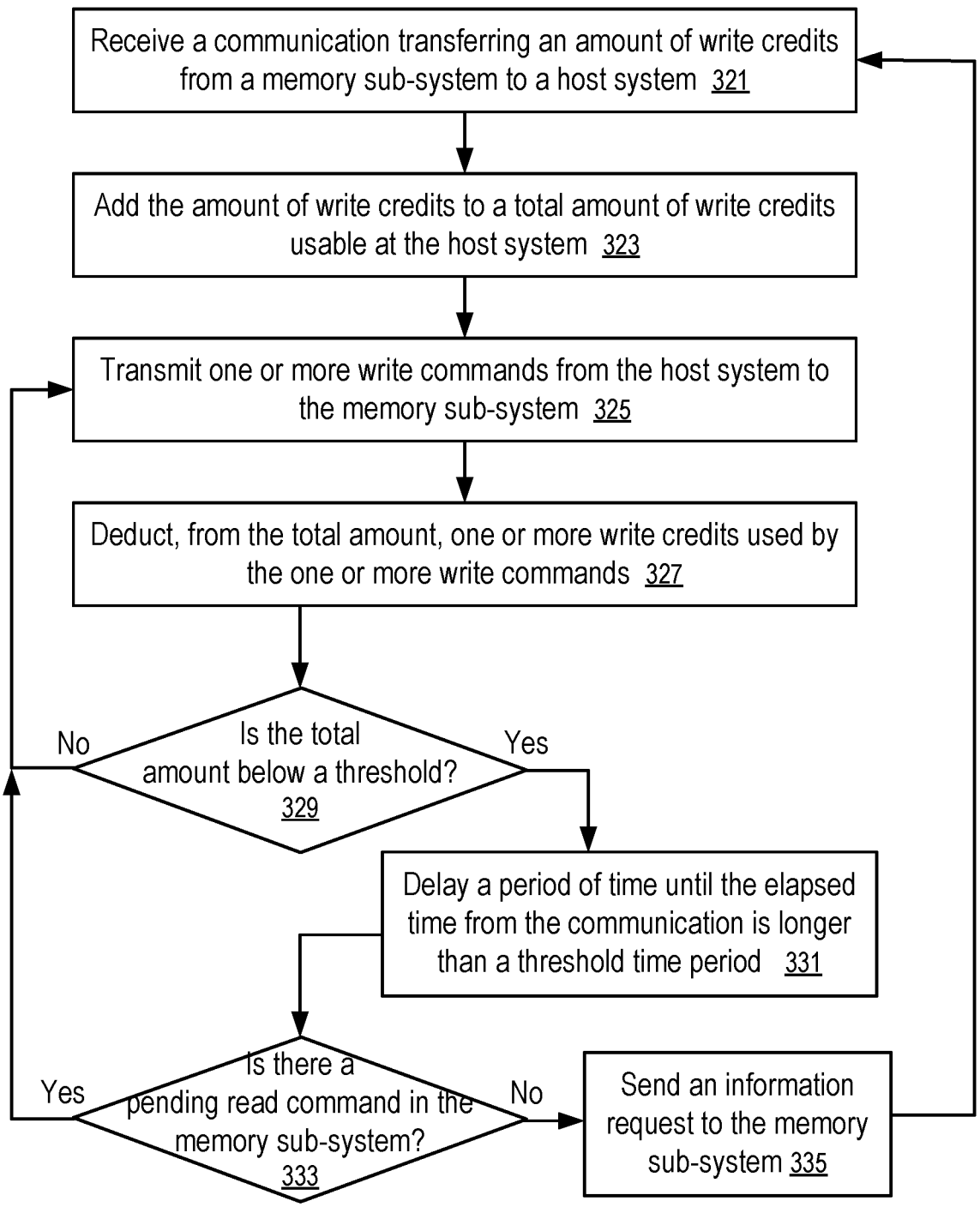
FIG. 4 is a flow diagram of a detailed example method to optimize information requests in accordance with some embodiments of the present disclosure.

FIG. 4 is a flow diagram of a detailed example method to optimize information requests in accordance with some embodiments of the present disclosure. The method of FIG. 4 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 4 is performed at least in part by the information request manager 113 of FIG. 1 or 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 321, the memory controller 116 of the host system 120 receives a communication transferring an amount of write credits from a memory sub-system 110 to the host system 120. For example, the transferring of write credits can be made using a communication protocol identified in the JEDEC NVDIMM-P Bus Protocol. For example, the amount of write credits can be communicated using the metadata bus 127 in response to the memory controller 116 placing a send command in the command bus 121. The memory controller 116 of the host system 120 can issue the send command in response to a response signal provided by the memory sub-system 110 on the transaction bus 125. An example of the response signal is RSPx_n identified in the JEDEC NVDIMM-P Bus Protocol. The response signal can be in response to a read command, such as XREAD or SREAD identified in the JEDEC NVDIMM-P Bus Protocol.

At block 323, the information request manager 113 adds the amount of write credits specified in the communication to a total amount of write credits usable at the host system 120. The total amount represents the total allocated/available buffer space for buffering write commands from the host system 120. When the total amount of write credits is sufficient to allow the host system 120 to transmit one or more write commands, the method can proceed to block 325.

At block 325, the memory controller 116 transmits one or more write commands from the host system 120 to the memory sub-system 110. The memory sub-system 110 buffers the one or more write commands for execution at time instances that are not controlled by the host system 120. Examples of write commands include WRITE, and PWRITE identified in the JEDEC NVDIMM-P Bus Protocol.

At block 327, the information request manager 113 deducts, from the total amount, one or more write credits used by the one or more write commands. By sending the one or more write commands, the host system 120 sends the write credits used by the one or more write commands to the memory sub-system 110.

At block 329, the information request manager 113 determines whether the total amount of write credits is now below a threshold. If the total amount is not below the threshold, the memory controller 116 can skip the blocks 331, 333 to 335 and perform other operations, such as transmitting 325 further write commands. However, transmitting 325 one or more write commands does not require the total amount of write credits to be above the threshold. A write command can be transmitted when the total amount of write credits is no less than the write credits used by the write command. Optionally, the memory controller 116 can also transmit read commands to retrieve data from memory components 109A to 109N, such as XREAD or SREAD in the JEDEC NVDIMM-P Bus Protocol. The memory sub-system 110 can optionally provide write credits in connection with responding to the read commands and cause the memory controller 116 to receive 321 a write credit increment communication.

At block 331, if the total amount of write credits at the host system 120 is below the threshold, the information request manager 113 can delay a period of time until the elapsed time from the most recent write credit communication is longer than a threshold time period. The threshold time period allows the memory sub-system 110 to process buffered write commands and reclaim the write credits used by the completed write commands such that the reclaimed write credits can be transferred to the host system 120.

The threshold time period can be a predetermined time interval, or a time interval calculated by the information request manager 113 based on statistical data on how fast the memory sub-system 110 can reclaim write credits. For example, the time interval can be calculated as a running average of time periods between adjacent write credit communications (e.g., communications that transfer more than a predetermined level of write credits). For example, based on the time period between two adjacent write credit communications and the write credits provided in a later one of the two write credit communications, the information request manager 113 can compute an estimated speed of the memory sub-system 110 completing buffered write commands and reclaim write credits. For example, the information request manager 113 can compute a running average of estimated speeds in multiple time intervals between adjacent write credit communications. The information request manager 113 can use the speed to determine a threshold time period. After the threshold time period from the previously write credit communication, the memory sub-system 110 is predicted to have completed a set of buffered write commands. The completed write commands allow the memory sub-system 110 to reclaim at least the predetermined level of write credits. The reclaimed write credits can be transferred to the host system 120 in a response to the information request sent after the threshold time period.

Figure 5:
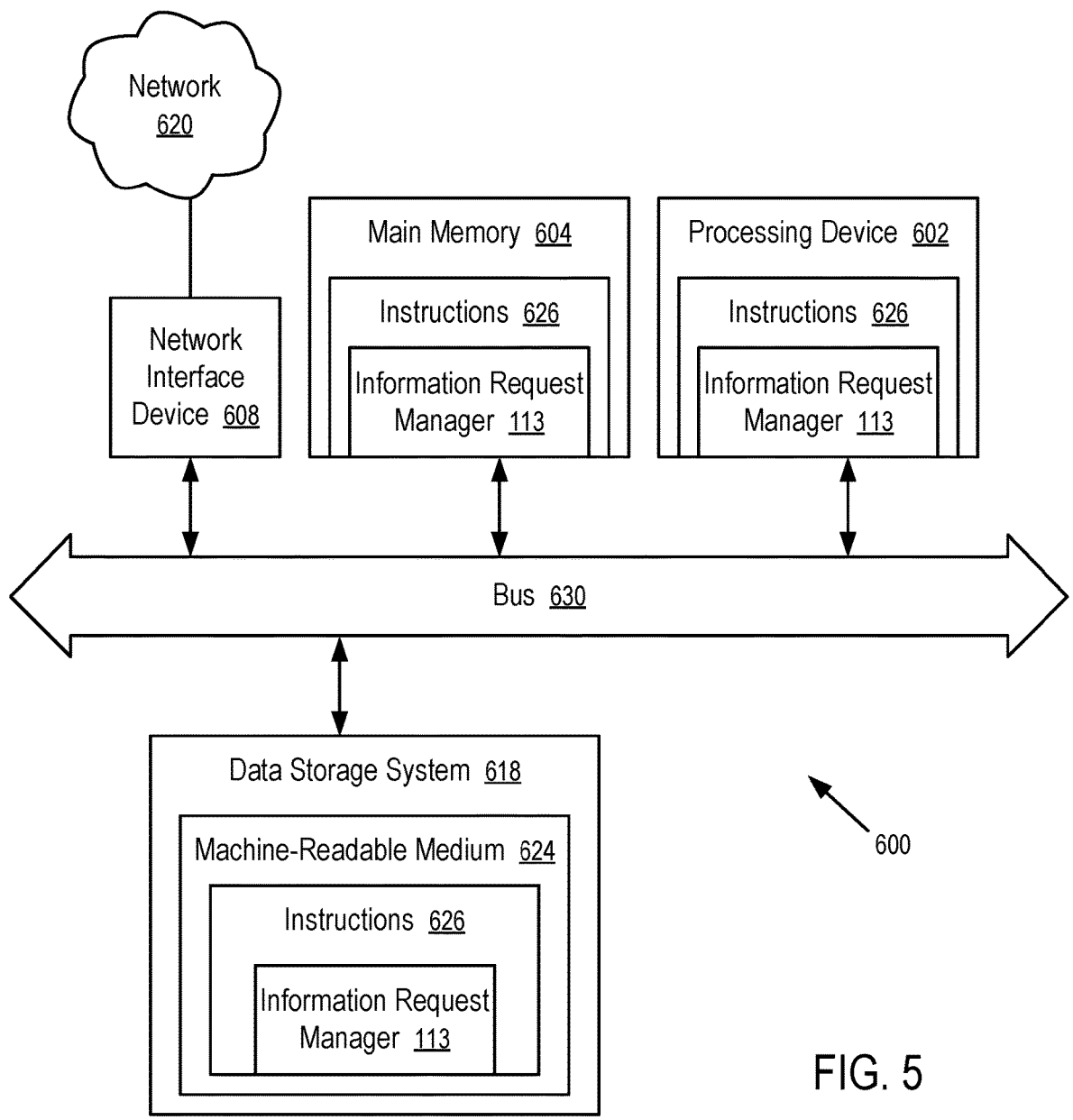
FIG. 5 is a block diagram of an example computer system in which embodiments of the present disclosure can operate.

FIG. 5 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of an information request manager 113 (e.g., to execute instructions to perform operations corresponding to the information request manager 113 described with reference to FIGS. 1, 2, 3, and 4). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

Processing device 602 represents one or more general-purpose processing devices such as a microprocessor, a central processing unit (CPU), or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), a graphics processing unit (GPU), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an information request manager 113 (e.g., the information request manager 113 described with reference to FIGS. 1, 2, 3, and 4). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A host system, comprising:
a processing device; and
a controller, operatively connected to a memory sub-system via a communication channel, to:
store information identifying an amount of available capacity of a buffer of the memory sub-system;
transmit, through the communication channel to the memory sub-system, one or more write commands to store data in memory components of the memory sub-system; and
update the information by deducting, from the amount of available capacity, an amount of buffer capacity used by the one or more write commands.

2. The host system of claim 1, wherein the controller is further to:
determine whether to generate the information request to the memory sub-system based at least in part on whether or not the memory sub-system has responded to a read command transmitted from the host system to the memory sub-system.

3. The host system of claim 2, wherein the controller is further to:
postpone generation of the information request until the current amount of available capacity is less than a threshold.

4. The host system of claim 3, wherein the controller is further to:
postpone generation of the information request until the current amount of available capacity is less than a threshold and the memory sub-system has no read command for which the memory sub-system has not yet provided a response to the host system.

5. The host system of claim 1, wherein the controller is further to:
generate the information request based at least in part on a time interval.

6. The host system of claim 5, wherein the controller is further to:
postpone generation of the information request until elapsed time from a first communication between the host system and the memory sub-system about available capacity of the buffer is longer than the time interval.

7. The host system of claim 6, wherein the controller is further to:
update the time interval based on a time period between the first communication and a second communication between the host system and the memory sub-system about available capacity of the buffer.

8. The host system of claim 7, wherein the time interval is updated further based on an amount of available capacity of the buffer allocated to the host system in the first communication.

9. The host system of claim 1, wherein the processing device is further to:
predict an amount of capacity of the buffer that is available in the memory sub-system for allocation to the host system for transmitting write commands; and
postpone generation of the information request until the predicted amount is above a threshold.

10. The host system of claim 1, wherein the memory components include non-volatile memory; the communication channel between the host system and the memory sub-system includes:
a command bus to transmit the one or more write commands;
a data bus to transmit the data requested to be stored by the one or more write commands; and
a transaction bus to transmit, from the memory system to the host system, a response signal for the information request.

11. The host system of claim 10, wherein the write commands, the information request, and the response signal are in accordance with a communication protocol for non-volatile dual in-line memory modules.

12. A method, comprising:
storing, in a host system coupled to a memory sub-system via a communication channel, information identifying an amount of available capacity of a buffer of the memory sub-system;
transmitting, through the communication channel to the memory sub-system, one or more write commands to store data in memory components of the memory sub-system; and
updating the information by deducting, from the amount of available capacity, an amount of buffer capacity used by the one or more write commands.

13. The method of claim 12, further comprising:
postponing the generation of the information request until elapsed time from a previous communication between the host system and the memory sub-system is longer than the time interval, and the current amount of available capacity is less than a threshold.

14. The method of claim 13, further comprising:
updating the time interval based on a time period between the previous communication and a communication that is before the previous communication and between the host system and the memory sub-system about available capacity of the buffer.

15. The method of claim 14, wherein the time interval is updated further based on an amount of available capacity of the buffer allocated to the host system in the previous communication.

16. The method of claim 12, further comprising:
predicting an amount of capacity of the buffer that is available in the memory sub-system for allocation to the host system for transmitting write commands; and
postponing generation of the information request until the predicted amount is above a threshold.

17. The method of claim 12, wherein the write commands and the information request are in accordance with a communication protocol for non-volatile dual in-line memory modules; and the communication channel between the host system and the memory sub-system includes:
a command bus to transmit the one or more write commands;
a data bus to transmit the data requested to be stored by the one or more write commands; and
a transaction bus to transmit, from the memory system to the host system, a response signal for the information request.

18. A non-transitory computer-readable storage medium storing instructions that, when executed by a processing device, cause the processing device to:
- store, in a host system coupled to a memory sub-system via a communication channel, information identifying an amount of available capacity of a buffer of the memory sub-system, wherein the host system transmits, through the communication channel to the memory sub-system, one or more write commands to store data in memory components of the memory sub-system; and
- update the information by deducting, from the amount of available capacity, an amount of buffer capacity used by the one or more write commands.

19. The non-transitory computer-readable storage medium of claim 18, wherein the instructions, when executed by the processing device, further cause the processing device to:
- calculate a time interval based on the predicted amount being above a threshold;
- wherein the generation of an information request is postponed until elapsed time from a previous communication between the host system and the memory sub-system is longer than the time interval.

20. The non-transitory computer-readable storage medium of claim 18, wherein the instructions, when executed by the processing device, further cause the processing device to:
- update the time interval based on an amount of available capacity of the buffer allocated to the host system in the previous communication.

* * * * *